United States Patent [19]

Sauer

[11] 4,348,602
[45] Sep. 7, 1982

[54] CURRENT COMPARATOR CIRCUIT WITH DEADBAND

[75] Inventor: Don R. Sauer, San Jose, Calif.

[73] Assignee: National Semiconductor Corporation, Santa Clara, Calif.

[21] Appl. No.: 187,007

[22] Filed: Sep. 15, 1980

[51] Int. Cl.³ .................... H03K 5/153; 307 291;299 B;354;360;530

[52] U.S. Cl. .................... 307/530; 307/354; 330/257

[58] Field of Search ............ 330/257, 307/291, 299.3, 354, 360, 530

[56] References Cited

U.S. PATENT DOCUMENTS 4,069,460  1/1978  Sauer .................... 330/257

*Primary Examiner*—James B. Mullins
*Attorney, Agent, or Firm*—Gail W. Woodward; James A. Sheridan; Neil B. Schulte

[57] ABSTRACT

A pair of differentially related currents are caused to flow in a pair of current modes. A symmetrical current mirror is coupled to the nodes and level shifting means coupled from each node to the current mirror common terminal. A pair of output transistors have their bases directly coupled to the nodes and their emitters cross coupled to the same nodes so that when the nodes are driven to a one $V_{BE}$ differential, output collector current will flow. The output transistors have their collectors commonly coupled to the circuit output. Deadband control means are connected to the current mirror common terminal so that no output current will flow until the deadband differential is exceeded.

8 Claims, 3 Drawing Figures

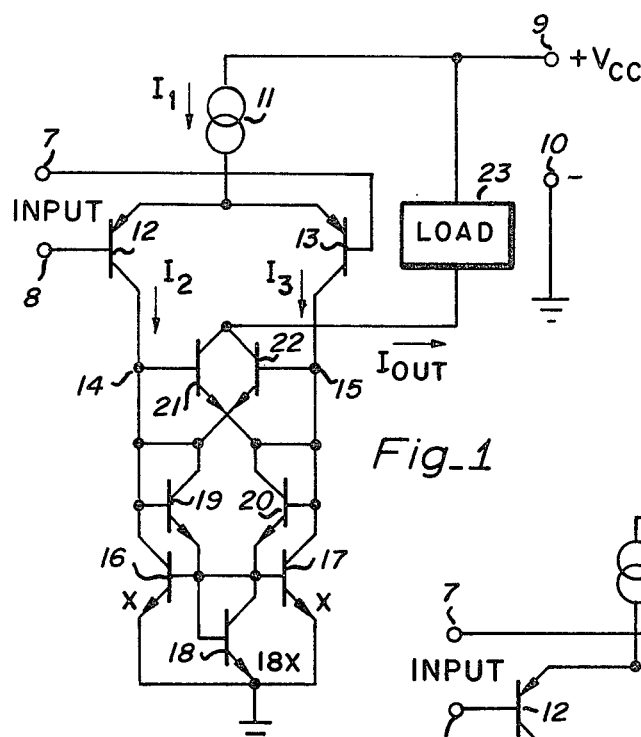
Fig_1
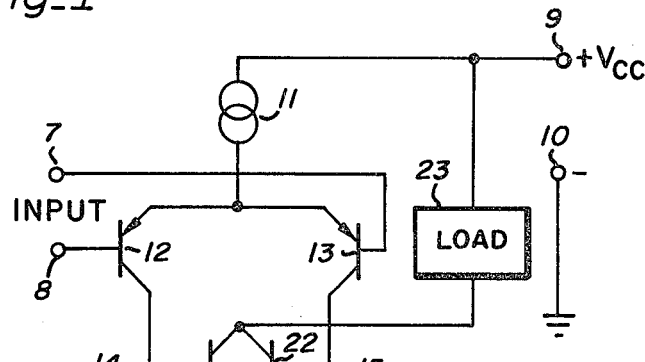
Fig_2
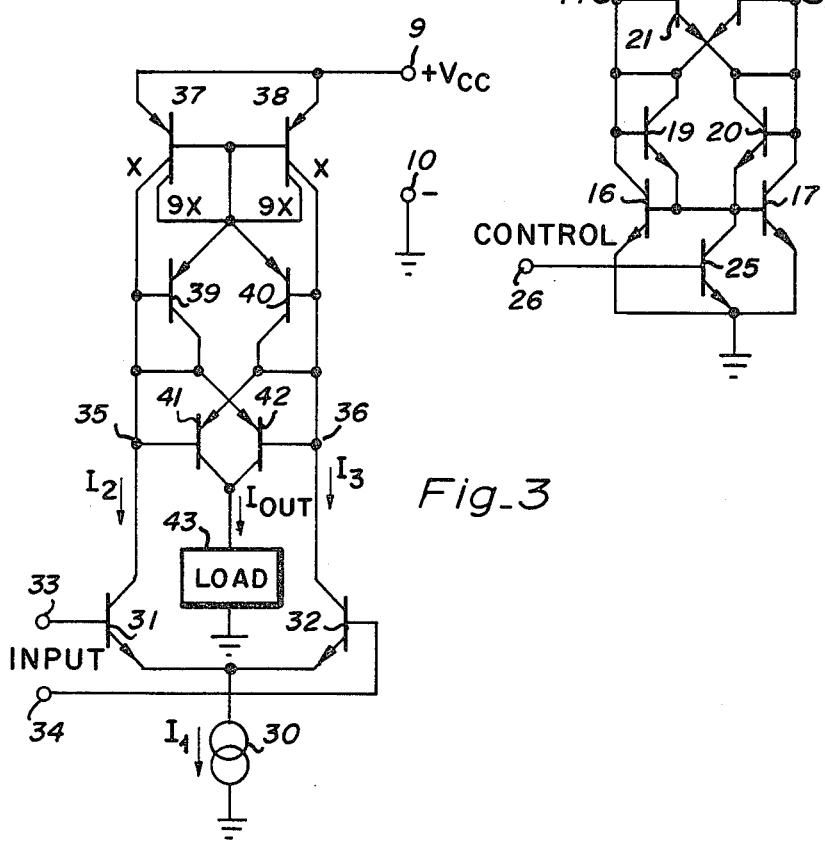
Fig_3

CURRENT COMPARATOR CIRCUIT WITH DEADBAND

BACKGROUND OF THE INVENTION

In my U.S. Pat. No. 4,069,460, which issued Jan. 17, 1978, to the assignee of the present invention, a current comparator is disclosed. This comparator has an output equal to the difference between the two currents flowing in the input nodes. The comparator was described as having very high sensitivity in that differential currents of 0.01% could be detected. Thus, the circuit has a vanishingly small deadband range. Deadband would be defined as the range of differential current values for which there would be no output. Thus, in patent 4,069,460, with one milliampere currents being compared, a current difference of only 10 picoamperes would be detected.

Current comparators have proven to be useful in monolithic integrated circuit (IC) designs. However, there are situations where it would be desirable to have a comparator with a relatively large controlled deadband. For example, in AM radio stereo systems phase detectors may be employed to decode one of the stereo channels. Such systems are often subject to spurious responses that make stereo reception difficult. Typically, such spurious responses mistune the phase detectors. If a current comparator is coupled to sense the currents in the phase detector and its deadband adjusted to accommodate a normal tuning range, excess phase can be sensed at the output of the comparator. When such a condition is sensed, the system can be switched to nonaural or an indicator operated to show mistuning.

SUMMARY OF THE INVENTION

It is an object of the invention to provide a current comparator circuit in which there is no output until a deadband limit isexceeded.

It is a further object of the invention to create a deadband in a current comparator that can readily be controlled.

It is a still further object of the invention to provide a current comparator suitable for use in IC construction in which a deadband is created and determined by geometrical designs.

These and other objects are achieved in a circuit configured as follows. Means are provided for producing differentially related currents in a pair of circuit nodes. This will typically be a differential pair driver stage. A current mirror is coupled to the nodes. The current mirror has level shifting means coupled between its common terminal and each node. The common terminal is also provided with current bypassing means. A pair of output transistors are coupled to the nodes with their bases directly coupled and their emitters cross coupled. Their collectors, coupled together, comprise the circuit output. In the NPN device version, the current bypassing means is a diode connected transistor ratioed with respect to the current mirror devices. The ratioing determines the deadband response level below which no output current flows. Alternatively, the diode connected transistor can be replaced with a single transistor which has its base connected to a deadband programming voltage.

In the PNP version, the current mirror comprises a pair of dual collector transistors, each of which has a collector returned to their common base connection. The other collector in the pair is coupled to the circuit nodes. In this structure, the collector pair is ratioed to determine the deadband range. This PNP version, which employs lateral transistor IC construction, lends itself particularly well to IC construction and is therefore preferred.

BRIEF DESCRIPTION OF THE DRAWING

FIG. 1 is a schematic diagram of a current comparator using mainly NPN transistor with emitter ratioing of NPN transistors for deadband control.

FIG. 2 is a schematic diagram of an alternative circuit with deadband programming control.

FIG. 3 is a schematic diagram of a current comparator using mainly PNP transistors with plural collector ratioing for deadband control.

DESCRIPTION OF THE INVENTION

For the following discussion, it will be assumed that transistor base current can be neglected relative to collector current. This is a workable assumption because IC NPN transistors can be commonly produced where the base current is less than 0.5% of the collector current.

IN FIG. 1, a source of operating potential is connected between $+V_{CC}$ terminal 9 and ground terminal 10. A current source 11 applies a constant current $I_1$ to differential input pair transistors 12 and 13. An input signal at terminals 7 and 8 produces differential currents $I_2$ and $I_3$ in nodes 14 and 15 respectively so that $I_1 = I_2 + I_3$.

Transistors 16 and 17 are connected as a current mirror to nodes 14 and 15 and they share a common diode connected transistor 18. The area of transistor 18 is shown 18 times as large as the areas of transistors 16 and 17. It is to be understood that this ratio is exemplary and other values could be employed. Diode connected transistors 19 and 20 couple the current mirror bases to nodes 14 and 15 to act as level shifters. Thus, nodes 14 and 15 will nominally operate at two $V_{BE}$ values above ground.

Output transistors 21 and 22 have their bases connected to nodes 14 and 15 while their emitters are cross connected to the same nodes. The output transistor 21 and 22 have their collectors returned to $+V_{CC}$ by way of load 23.

For zero or small signal inputs, there will be balanced current mirror operation and nodes 14 and 15 will be substantially at the same potential so that there will be no output. By way of an example, an $I_1$ value of 2 mA will be assumed. $I_2$ and $I_3$ will be one mA each for zero signal. Because of the ratios between transistors 16, 17, and 18, about 0.1 mA will flow in transistors 16 and 17. About 1.8 mA will flow in transistor 18. With increasing signal, $I_2$ and $I_3$ will have differential values and at some signal level $I_2$ will drop to 0.1 mA. At this point, diode connected transistor 19 will stop conducting and transistor 16 will pull node 14 down. This will turn transistor 22 on. The base of transistor 22 will be held at two $V_{BE}$ above ground by the action of $I_3$. Thus, any further drop in $I_2$ will produce current flow in load 23.

It can be seen that the ratioing of transistor 18 with respect to transistors 16 and 17 will produce a related deadband. The deadband will be proportional to the ratio. If transistors 18 is made twice the area of transistors 16 and 17, it can be seen that 0.5 mA will flow in transistors 16, 17, 19, and 20 while one mA will flow in transistor 18 for zero signal conditions. When $I_3$ (or $I_2$)

drops to 0.5 mA, current $I_{OUT}$ will start to flow in load 23. This shows that a 9:1 change in the area of transistor 18 will change the current threshold by a factor of 5:1. The circuit of FIG. 1 could be regarded as a class C frequency doubling amplifier with a signal threshold that is set by geometrical means.

FIG. 2 shows a circuit similar to that of FIG. 1 except that the deadband range is electrically programmed. Here, transistor 25 replaces the diode connected transistor 18 of FIG. 1. The conduction in transistor 25 is set by the control signal applied at terminal 26. If terminal 26 is grounded, transistor 25 will be off and the circuit will function as described in my U.S. Pat. No. 4,069,460 with little or no deadband. As the signal at terminal 26 is raised to increase conduction in transistor 25, the deadband range will be increased. Thus, the deadband can be electrically programmed to a desired value.

FIG. 3 shows a complementary version of the circuit of FIG. 1 and has some unusual characteristics. Here, current sink 30 passes $I_1$ from transistors 31 and 32 which are coupled to input terminals 33 and 34. This creates differentially related currents $I_2$ and $I_3$ at nodes 35 and 36 so that $I_1 = I_2 + I_3$.

Nodes 35 and 36 are coupled to a current mirror source made up of plural collector transistors 37 and 38. Each of these transistors is shown having two collectors, one of which is returned to the commonly connected base terminals. The collectors are shown ratioed at 9:1 with the larger ones returned to the bases. The smaller of the collectors of transistors 37 and 38 are directly coupled to nodes 35 and 36 respectively. Diode connected transistors 39 and 40 act as level shifters coupled between the common base terminal of transistors 37 and 38 and nodes 35 and 36. Output transistors 41 and 42 have their collectors commonly coupled to load 43 where $I_{OUT}$ flows. The bases of transistors 41 and 42 are coupled to nodes 35 and 36 respectively while their emitters are cross coupled thereto.

Assuming $I_1$ to be 2 mA, the zero signal values of $I_2$ and $I_3$ will be one mA each. Thus, the smaller collectors of transistors 37 and 38 will pass 0.1 mA each, while 1.8 mA will flow in the combined larger collectors. It can be seen that the current division is the same as was described for FIG. 1. Also, when the signal at terminals 33 and 34 differentially drives nodes 35 and 36 to where one of $I_2$ or $I_3$ drops below 0.1 mA, the associated diode 39 or 40 will stop conducting and the related node pulled low. This action will turn on transistor 41 or 42 depending upon which base is pulled low and produces current $I_{OUT}$ in load 43. Thus, a deadband is produced in which no output current flows until a particular signal level is exceeded. The deadband is related to the geometrical ratio of the lateral collectors in transistors 37 and 38.

The circuit of FIG. 3 has particular significance with respect to conventional monolithic IC construction. As a practical matter, transistors 37 and 38 can be constructed as a single lateral PNP unit having a common emitter and base and four collectors surrounding the common emitter in the form of a segmented ring. In addition, lateral transistors 39 and 41 can be fabricated into the isolated collector region of transistor 31 while transistors 40 and 42 can be fabricated into the isolated collector region of transistor 32. Thus, the circuit of FIG. 3 is the preferred IC embodiment.

The invention has been described and complementary versions detailed. When a person skilled in the art reads the foregoing, alternatives and equivalents within the spirit and intent of the invention will occur to him. Accordingly, it is intended that the scope of the invention be limited only by the following claims.

I claim:

1. A current comparator circuit with controlled deadband wherein the difference between differential currents is sensed and an output provided when said difference exceeds a predetermined value, said circuit comprising:
   a pair of circuit nodes;
   means for passing differential currents through said nodes;
   current mirror means coupled to said nodes, said current mirror means having a common control terminal, a pair of current reflecting terminals coupled to said nodes, and deadband control means coupled to said common control terminal;
   level shifting means coupled between said common control terminal and ech of said nodes; and
   a pair of output transistors having their collectors commonly coupled to provide said output, their bases coupled to said nodes and their emitters cross coupled to said nodes whereby said output only occurs when said differential currents exceed a difference limit determined by said deadband control means.

2. The circuit of claim 1 wherein said level shifting means are diode connected transistors.

3. The circuit of claim 2 wherein said current mirror means, said level shifting means and said output transistors are all NPN transistors.

4. The circuit of claim 3 wherein said deadband control means comprises a diode connected NPN transistor that is ratioed in size with respect to the size of said current mirror transistors.

5. The circuit of claim 3 wherein said deadband control means is an NPN transistor with separate biasing means to control said deadband.

6. The circuit of claim 2 wherein said current mirror means, said level shifting means and said output transistors are all PNP transistors.

7. The circuit of claim 6 wherein said current mirror means comprise plural collector lateral transistors with one collector returned directly to its base and another collector returned to one of said nodes.

8. The circuit of claim 7 wherein said plural collectors are ratioed to control said deadband.

* * * * *